(12) United States Patent
Singh et al.

(10) Patent No.: US 12,087,594 B2
(45) Date of Patent: Sep. 10, 2024

(54) COLORED GRATINGS IN MICROELECTRONIC STRUCTURES

(71) Applicant: INTEL CORPORATION, Santa Clara, CA (US)

(72) Inventors: Gurpreet Singh, Portland, OR (US); Eungnak Han, Portland, OR (US); Manish Chandhok, Beaverton, OR (US); Richard E Schenker, Portland, OR (US); Florian Gstrein, Portland, OR (US); Paul A. Nyhus, Portland, OR (US); Charles Henry Wallace, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 754 days.

(21) Appl. No.: 17/124,730

(22) Filed: Dec. 17, 2020

(65) Prior Publication Data

US 2022/0199420 A1 Jun. 23, 2022

(51) Int. Cl.
*H01L 21/311* (2006.01)
*H01L 21/768* (2006.01)

(52) U.S. Cl.
CPC .. *H01L 21/31144* (2013.01); *H01L 21/76811* (2013.01); *H01L 21/76816* (2013.01); *H01L 21/76831* (2013.01)

(58) Field of Classification Search
None
See application file for complete search history.

(56) References Cited

U.S. PATENT DOCUMENTS

| 8,790,522 | B1 | 7/2014 | Schmid et al. |
| 9,054,164 | B1 | 6/2015 | Jezewski et al. |
| 9,379,010 | B2 | 6/2016 | Jezewski et al. |
| 2021/0375745 | A1* | 12/2021 | Blackwell ............ C08F 265/02 |

FOREIGN PATENT DOCUMENTS

| WO | 2018063376 A1 | 4/2018 |
| WO | 2019190463 A1 | 10/2019 |
| WO | 2019190499 A1 | 10/2019 |

OTHER PUBLICATIONS

European Extended Search Report issued in EP Application No. 21198414.1 on May 17, 2022; 7 pages.

* cited by examiner

*Primary Examiner* — Hsien Ming Lee
(74) *Attorney, Agent, or Firm* — Akona IP PC

(57) ABSTRACT

Disclosed herein are colored gratings in microelectronic structures. For example, a microelectronic structure may include first conductive structures alternating with second conductive structures, wherein individual ones of the first conductive structures include a bottom portion and a top portion, individual cap structures are on individual ones of the second conductive structures, the bottom portions of the first conductive structures are laterally spaced apart from and aligned with the second conductive structures, and the top portions of the first conductive structures are laterally spaced apart from and aligned with the cap structures. In some embodiments, a microelectronic structure may include one or more unordered lamellar regions laterally spaced apart from and aligned with the first conductive structures.

20 Claims, 13 Drawing Sheets

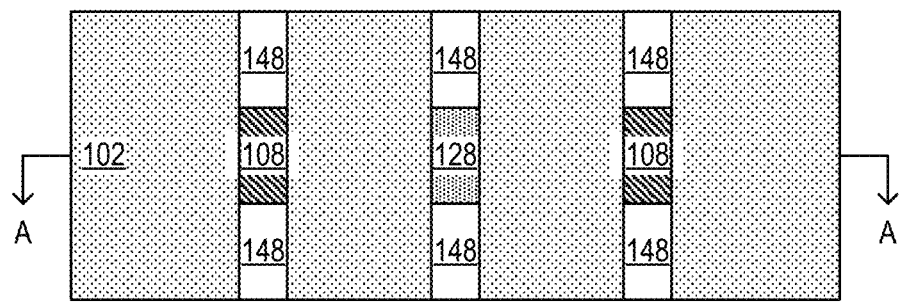
FIG. 11A
FIG. 11B
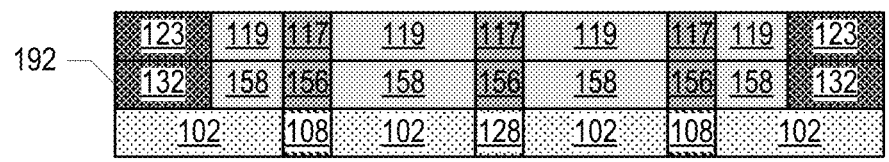
FIG. 12A
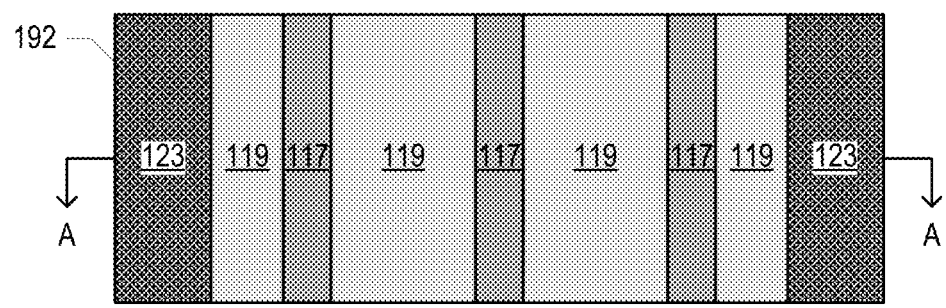
FIG. 12B

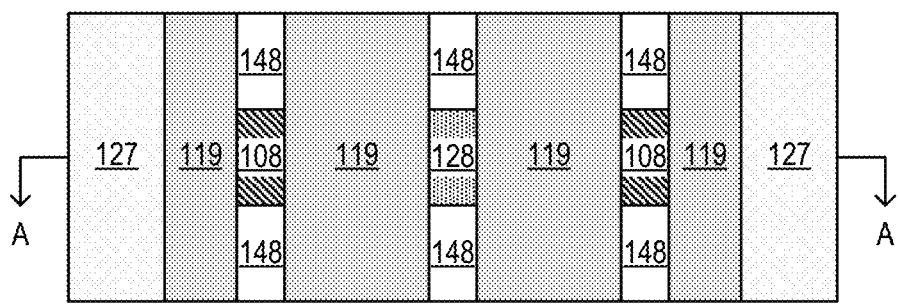
FIG. 13A
FIG. 13B
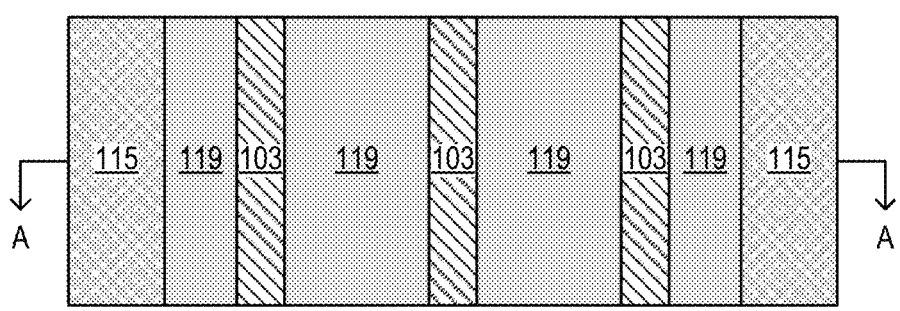
FIG. 14A
FIG. 14B

COLORED GRATINGS IN MICROELECTRONIC STRUCTURES

BACKGROUND

Conventional microelectronic fabrication techniques may not be able to reliably pattern particularly small features. Consequently, the size and performance of microelectronic devices has been limited.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 2, 3A-3B, 4A-4B, 5A-5B, 6A-6B, 7A-7B, 8A-8B, 9A-9B, 10A-10B, 11A-11B, 12A-12B, 13A-13B, 14A-14B, 15A-15B, 16A-16B, 17A-17B, 18A-18B, 19A-19B, 20A-20B, 21A-21B, and 22A-22B illustrate stages in an example process for manufacturing the microelectronic structure of FIG. 1.

DETAILED DESCRIPTION

Figure 1A:
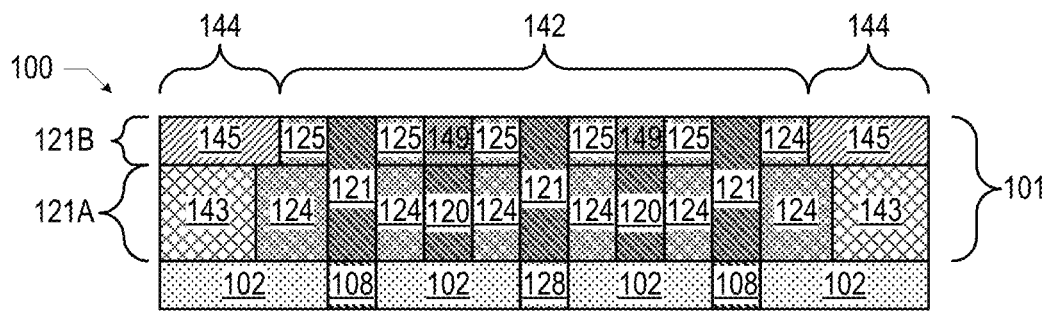
FIGS. 1A-1C are various views of a microelectronic structure including aligned conductive structures, in accordance with various embodiments.

Disclosed herein are colored gratings in microelectronic structures. For example, a microelectronic structure may include first conductive structures alternating with second conductive structures, wherein individual ones of the first conductive structures include a bottom portion and a top portion, individual cap structures are on individual ones of the second conductive structures, the bottom portions of the first conductive structures are laterally spaced apart from and aligned with the second conductive structures, and the top portions of the first conductive structures are laterally spaced apart from and aligned with the cap structures. In some embodiments, a microelectronic structure may include one or more unordered lamellar regions laterally spaced apart from and aligned with the first conductive structures.

Existing conventional lithography techniques, such as existing conventional extreme ultraviolet (EUV) techniques, may not be able to pattern features that are both sufficiently small and have sufficiently few defects to be used in commercial microelectronic devices. For example, conventional EUV lithography may suffer from high roughness and excessive bridging defects at tight pitches (e.g., pitches below 32 nanometers), which may limit or effectively prevent deployment of EUV patterning techniques (e.g., spacer-based pitch-division techniques having resist "backbones" defined by EUV lithography). Conventional EUV lithographic techniques also suffer from a trade-off between EUV dose and resist thickness; although higher EUV doses have the potential to pattern lines with lower roughnesses, such higher EUV doses typically require thinner resist layers in order to achieve a desired depth of focus and avoid pattern collapse, but these thinner resist layers typically cannot withstand etch transfer (i.e., the transfer of a pattern in the resist to one or more underlying layers) as well as thicker resists can. These constraints have provided significant barriers to the adoption of EUV techniques in commercial microelectronic fabrication processes.

Various ones of the embodiments disclosed herein may remedy the deficiencies of conventional EUV lithographic techniques through the use of fabrication techniques that include directed self-assembly (DSA) operations. DSA-based techniques may utilize the propensity of some materials to self-organize into particular patterns under certain conditions, and these patterns may be utilized in various ways to fabricate small and accurate features in a microelectronic device.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The phrase "A, B, or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

Figure 3A:
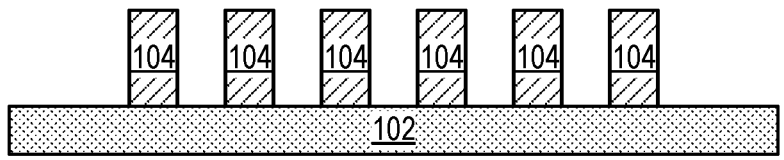
Figure 3B:
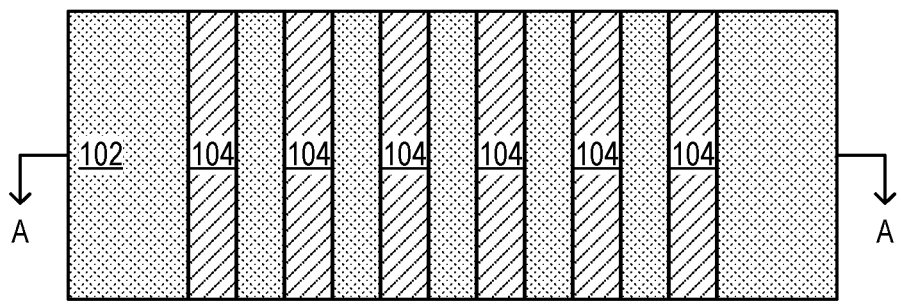

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "conductive" material refers to an electrically conductive material, unless otherwise specified. When used to describe a range of dimensions, the phrase "between X and Y" represents a range that includes X and Y. For convenience, the phrase "FIG. 1" may be used to refer to the collection of drawings of FIGS. 1A-1C, the phrase "FIG. 3" may be used to refer to the collection of drawings of FIGS. 3A-3B, etc. Although resist materials are referred to with various reference numerals repeated between different ones of the drawings (e.g., resist material 112, etc.), this is simply for ease of illustration, and a resist material having a specific reference numeral referred to in one of the drawings (e.g., the resist material 112 referred to in the drawings of FIG. 4) need not be the same resist material as the resist material having the same reference numeral referred to in another of the drawings (e.g., the resist material 112 referred to in the drawings of FIG. 8).

Figure 1B:
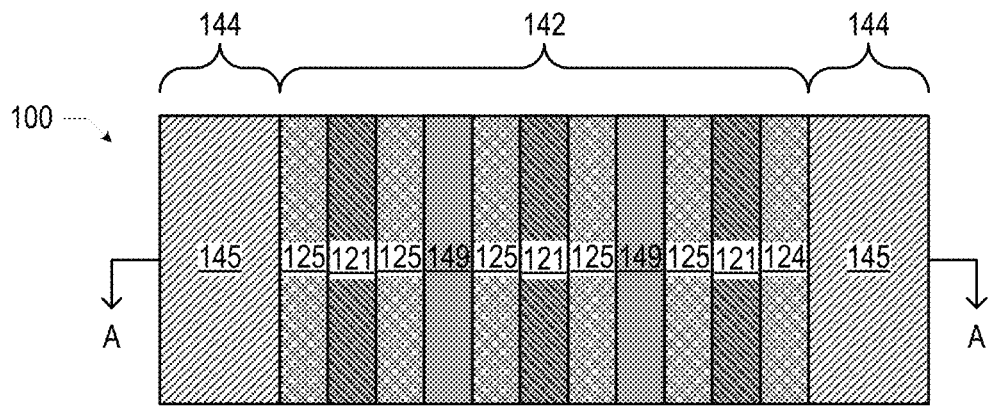
Figure 1C:
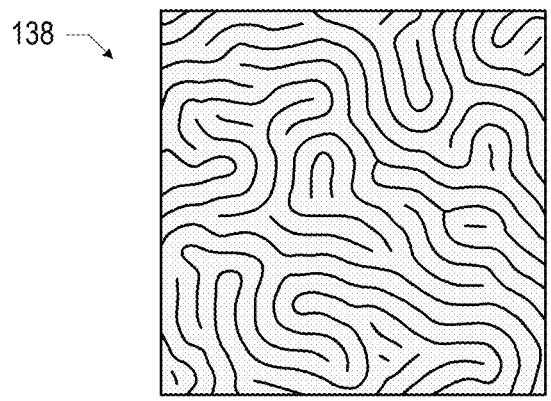

FIGS. 1A-1C are various views of an example microelectronic structure 100 including alternating first conductive structures 121 and second conductive structures 120. FIG. 1A is a side, cross-sectional view of the microelectronic structure 100 through the section A-A of FIG. 1B, FIG. 1B is a top view of the microelectronic structure 100, and FIG. 1C is a detailed top view of an unordered lamellar structure 138 of a microelectronic structure 100 (discussed further below). In some embodiments, the microelectronic structure 100 of FIG. 1 may be part of a metallization layer in a microelectronic device (e.g., as discussed below with reference to FIG. 24).

As noted above, the microelectronic structure 100 of FIG. 1 includes alternating first conductive structures 121 and second conductive structures 120. The first conductive structures 121 and the second conductive structures 120 may take the form of parallel arrangements of conductive materials, spaced apart by first spacers 124 and second spacers 125. In particular, bottom portions 121A of the first conductive structures 121 are aligned with the second conductive structures 120, with first spacers 124 in contact with and in between the bottom portions 121A of the first conductive structures 121 and the second conductive structures 120. Top portions 121B of the first conductive structures 121 are aligned with cap structures 149 on the second conductive structures 120, with second spacers 125 in contact with and in between the top portions 121B of the first conductive structures 121 and the cap structures 149. The sidewalls of the first conductive structures 121 and the second conductive structures 120 may be substantially straight. The straight sidewalls of the first conductive structures 121 may be a product of the DSA-based techniques disclosed herein used to form the first conductive structures 121; other approaches to fabricate similar conductive structures may result in a "mushroomed" top portion of those conductive structures, rather than straight sidewalls.

The first conductive structures 121 and the second conductive structures 120 may include any suitable materials. In some embodiments, the first conductive structures 121 may have a same material composition and/or arrangement as the second conductive structures 120, while in other embodiments, the first conductive structures 121 may have a different material composition and/or arrangement than the second conductive structures 120. The first conductive structures 121 and/or the second conductive structures 120 may include one or more layers of various materials, such as one or more layers of liner material and fill material. In some embodiments, a liner material may include tantalum, tantalum nitride, titanium, titanium nitride, cobalt, or ruthenium (e.g., combinations thereof) and a fill material may include tungsten, cobalt (e.g., as cobalt silicide), ruthenium, molybdenum, copper, silver, nickel (e.g., as nickel silicide), gold, aluminum, other metals or alloys, or other combinations of materials.

The first spacers 124 and the second spacers 125 may include any suitable dielectric materials. In some embodiments, the first spacers 124 may have a same material composition and/or arrangement as the second spacers 125, while in other embodiments, the first spacers 124 may have a different material composition and/or arrangement than the second spacers 125. For example, in some embodiments, the first spacers 124 and/or the second spacers 125 may include an inorganic dielectric material, such as silicon nitride, silicon carbide, silicon oxynitride, or silicon oxycarbide.

The sidewalls of the second conductive structures 120 may be aligned with corresponding sidewalls of the cap structures 149 (i.e., the second conductive structures 120 and the cap structures 149 may be "self-aligned," as discussed below). The cap structures 149 may include any suitable material. In some embodiments, the cap structures 149 may include a hardmask material. For example, the cap structures 149 may include silicon nitride. The first conductive structures 121 and the second conductive structures 120/cap structures 149 may be arranged as multiple parallel lines of material, as illustrated, and thus may provide a grating. Because of the different material compositions of alternating lines of this grating, the grating may be referred to as a "colored" grating. Such colored gratings may be particularly useful in mitigating edge placement errors during fabrication, as adjacent conductive lines in the grating may be spaced apart by insulating lines in the grating, reducing the likelihood that misalignment in the patterning of a next metallization layer will result in an undesired bridging between two conductive lines.

The first conductive structures 121 and the second conductive structures 120 may be disposed in a metallization layer 101 above a region of the microelectronic structure 100 that includes conductive contacts 108 and 128 in a lower structure 102. The lower structure 102 may include any suitable dielectric material (e.g., at its top surface) and/or conductive material. For example, in some embodiments, the lower structure 102 may include an inorganic dielectric material, such as silicon oxide, carbon-doped oxide, silicon nitride, silicon carbide, silicon oxynitride, silicon oxycarbide, or insulating metal oxides such as hafnium oxide and zirconium oxide. The conductive contacts 108 and 128 may provide electrical contacts to devices or other interconnects (not shown) in the lower structure 102 of the microelectronic structure 100. For example, in some embodiments, the conductive contacts 108 may be transistor gate contacts, while the conductive contacts 128 may be transistor source/drain contacts (or vice versa); the transistors themselves may be in a device layer "below" the conductive contacts 108/128 (e.g., as discussed below with reference to FIG. 24). The conductive contacts 108/128 may be in contact with first conductive structures 121 above the conductive contacts 108/128, with the sidewalls of the conductive contacts 108/128 aligned with corresponding sidewalls of the first conductive structures 121 (i.e., the conductive contacts 108/128 and the first conductive structures 121 may be "self-aligned," as discussed below). The particular arrangement of conductive contacts 108/128 in the microelectronic structure 100 of FIG. 1 is simply for purposes of illustration, and any desired arrangement of conductive contacts 108/128 may be used.

The first conductive structures 121 and the second conductive structures 120 may be part of a patterned region 142, and the microelectronic structure 100 may also include one or more unpatterned regions 144. In the microelectronic structure 100 of FIG. 1, the unpatterned regions 144 may include a first unordered lamellar region 143 that is aligned with the bottom portions 121A of the first conductive structures 121 (and aligned with the second conductive structures 120, as discussed above), and a second unordered lamellar region 145 that is aligned with the top portions 121B of the first conductive structures 121 (and aligned with the cap structures 149, as discussed above). When DSA-based techniques are used to manufacture the microelectronic structure 100 (e.g., as discussed below with reference to FIGS. 2-22), the first unordered lamellar region 143 and the second unordered lamellar region 145 of the unpatterned regions 144 may have an unordered lamellar structure 138 like that illustrated in FIG. 10. An unordered lamellar structure 138 may include one or more materials patterned according to the unordered lamellar structure of a DSA material that did not assume an ordered structure during preceding patterning operations (e.g., due to the absence of an ordered block copolymer (BCP) material over the unpatterned regions 144, as discussed below with reference to FIGS. 2-22). For example, as discussed below with reference to FIGS. 2-22, the first unordered lamellar region 143 may include a dielectric material 103, material having a same composition as the first spacers 124, and material having a same composition as the second conductive structures 120, while the second unordered lamellar region 145 may include material having a same composition as the cap structures 149, material having a same composition as the second spacers 125, and material having a same composition as the first conductive structures 121. The particular unordered lamellar pattern in the first unordered lamellar region 143 may be different than the particular unordered lamellar pattern in the second unordered lamellar region 145 because the unordered lamellar regions 143/145 may be patterned during different sets of DSA operations, as discussed below. The presence of an unordered lamellar structure 138, like that illustrated in FIG. 10, in an unpatterned region 144 of a microelectronic structure 100 may be indicative of the use of a DSA-based technique during fabrication of the patterned region 142. In some embodiments, the unpatterned region 144 may be part of a transition region of a die including the microelectronic structure 100, under a guard ring of a die including the microelectronic structure 100, or in a frame of a die including the microelectronic structure 100 (e.g., any of the dies 1502 discussed below with reference to FIG. 23).

FIGS. 2-22 illustrate stages in an example process of manufacturing the microelectronic structure 100 of FIG. 1, in accordance with various embodiments. Although the operations of the method of FIGS. 2-22 may be illustrated with reference to particular embodiments of the microelectronic structures 100 disclosed herein, the method of FIGS. 2-22 may be used to form any suitable microelectronic structures 100. Operations are illustrated once each and in a particular order in FIGS. 2-22, but the operations may be reordered and/or repeated as suitable (e.g., with different operations performed in parallel when manufacturing multiple microelectronic structures 100 simultaneously). In FIGS. 3-22, the "A" subfigures are side, cross-sectional views taken through the sections A-A of the "B" subfigures, while the "B" subfigures are top views.

Figure 2:
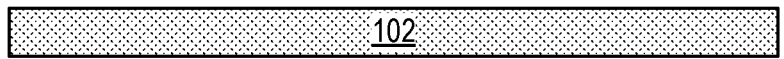

FIG. 2 is a side, cross-sectional view of an assembly including a lower structure 102. The lower structure 102 may take any of the forms disclosed herein, and in some embodiments, may include a device layer or a metallization layer (not shown), as discussed herein.

FIG. 3 illustrates an assembly subsequent to deposition and patterning of an initial grating of mask material 104 on the lower structure 102 of FIG. 2. The mask material 104 may include any suitable material different from the lower structure 102; in some embodiments, the mask material 104 may include titanium nitride, silicon nitride, silicon oxide, a silicon anti-reflective coating, a carbon-based hardmask, or amorphous silicon. The mask material 104 may be patterned using any suitable technique, such as a pitch-division technique (e.g., pitch-halving, pitch-quartering, etc.), a DSA technique, a lithographic technique, or any other technique or combinations of techniques.

Figure 4A:
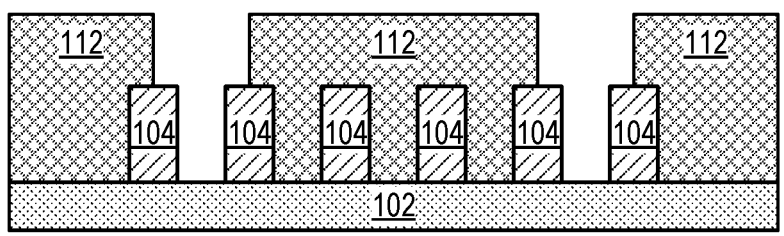
Figure 4B:
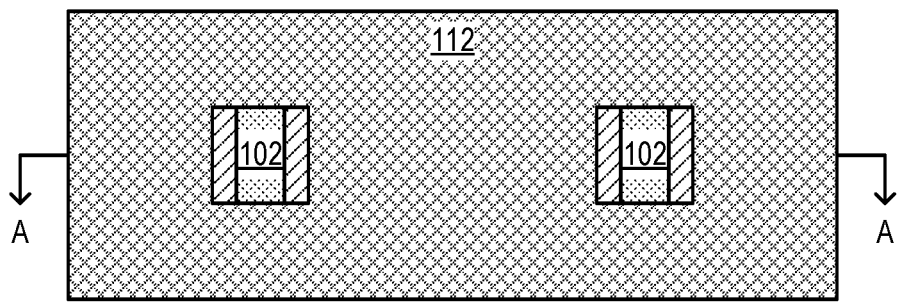

FIG. 4 illustrates an assembly subsequent to deposition and patterning of a resist material 112 on the assembly of FIG. 3. The resist material 112 may be deposited using any suitable technique (e.g., spin-coating), and may be patterned (e.g., lithographically) to form openings in the resist material 112 at the desired locations for the conductive contacts 108 (exposing a top surface of the lower structure 102 in those locations, between portions of the mask material 104).

Figure 5A:
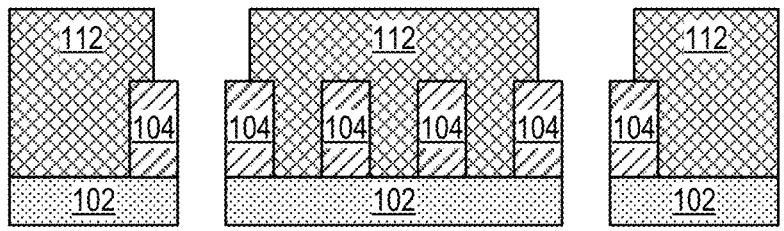
Figure 5B:
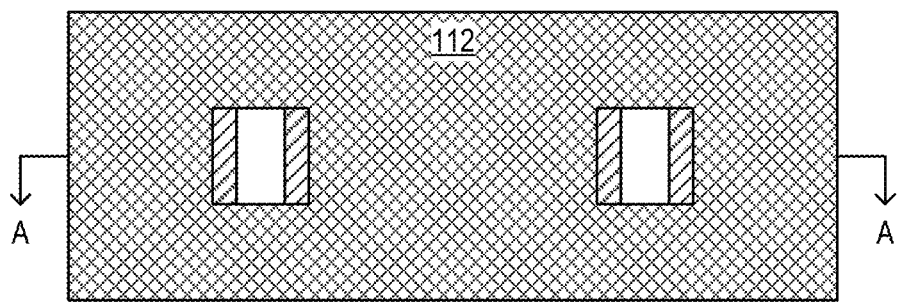

FIG. 5 illustrates an assembly subsequent to removing at least some of the exposed lower structure 102 (e.g., an exposed dielectric material) from the assembly of FIG. 4. Any suitable selective etch technique may be used to remove the portions of the lower structure 102.

Figure 6A:
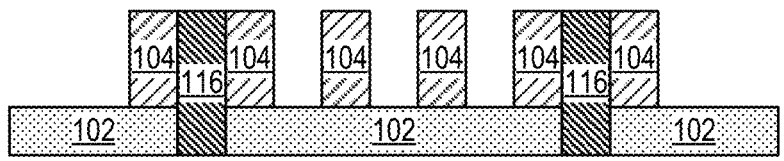
Figure 6B:
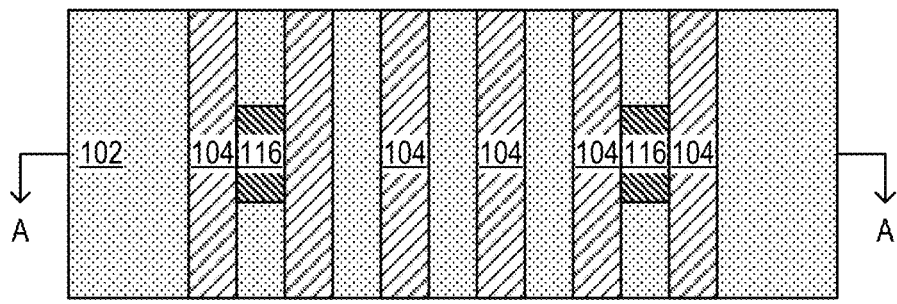

FIG. 6 illustrates an assembly subsequent to providing a sacrificial material 116 to the assembly of FIG. 5 (to fill the openings in the lower structure 102 and the adjacent volume between portions of mask material 104), planarizing the resulting assembly to remove the sacrificial material 116 above the mask material 104 (e.g., using a chemical mechanical polishing (CMP) process), then removing the remaining resist material 112. Any suitable deposition, planarization, and etch techniques may be used.

Figure 7A:
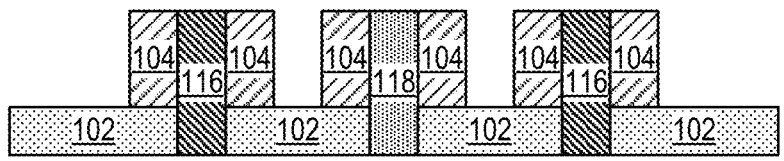
Figure 7B:
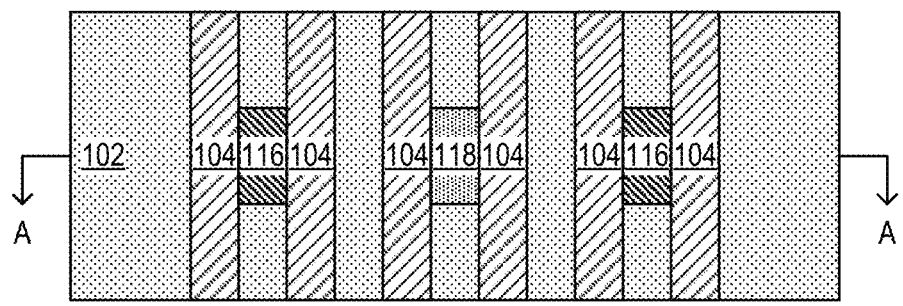

FIG. 7 illustrates an assembly subsequent to performing operations analogous to those of FIGS. 4-6 on the assembly of FIG. 6 to form structures of sacrificial material 118 at the desired locations for the conductive contacts 128. The operations of FIGS. 4-6 and 7 may be performed separately when the material to be etched during those operations (i.e., the portions of the lower structure 102) is different, and thus may require different etch chemistries and/or etch conditions.

Figure 8A:
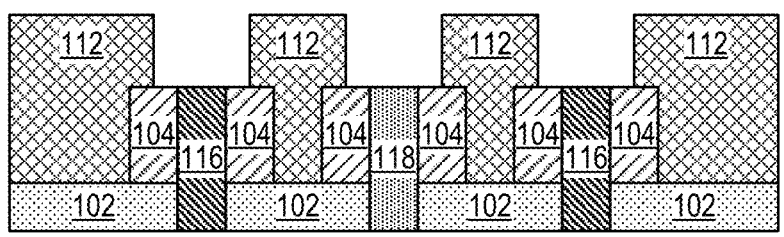
Figure 8B:
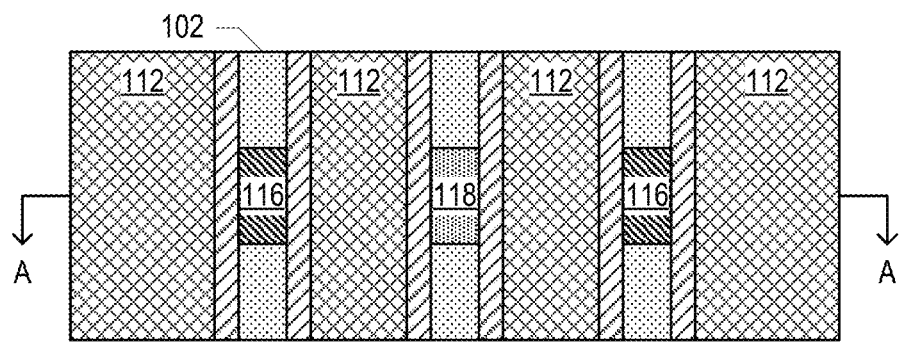

FIG. 8 illustrates an assembly subsequent to deposition and patterning of a resist material 112 on the assembly of FIG. 7. The resist material 112 may be deposited using any suitable technique (e.g., spin-coating), and may be patterned (e.g., lithographically) to form line openings in the resist material 112 to expose the sacrificial materials 116 and 118 and the lower structure 102 in the same "line." The pitch of the patterning of the resist material 112 may be twice the pitch of the initial grating of mask material 104.

Figure 9A:
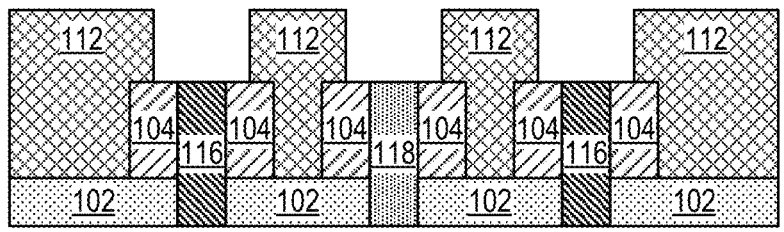
Figure 9B:
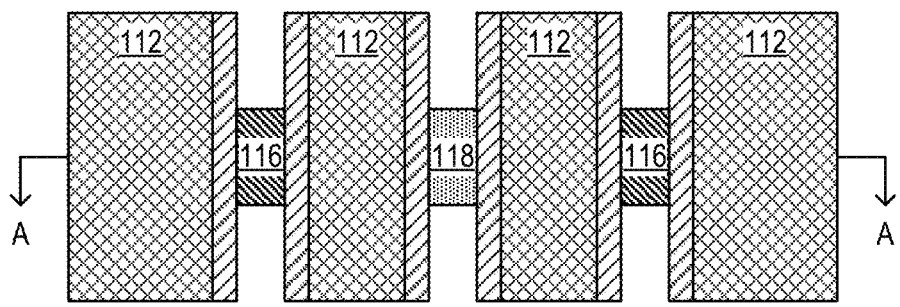

FIG. 9 illustrates an assembly subsequent to removing portions of the lower structure 102 (e.g., a dielectric material) exposed in the assembly of FIG. 8. Any suitable selective etch technique may be used.

Figure 10A:
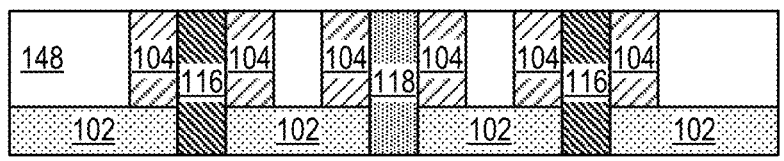
Figure 10B:
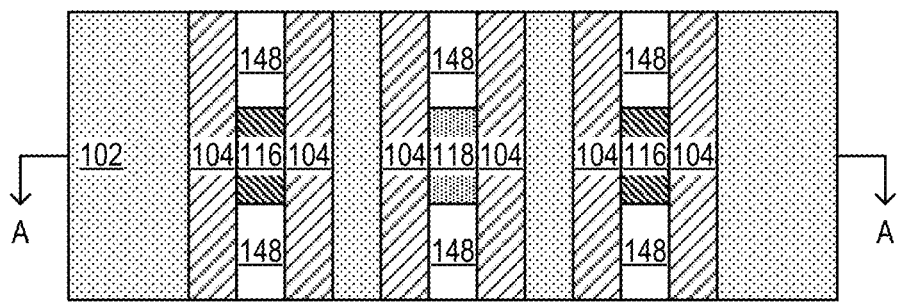

FIG. 10 illustrates an assembly subsequent to providing a metal oxide material 148 to the assembly of FIG. 9. The metal oxide material 148 may fill the volumes occupied by the lower structure 102 in the assembly of FIG. 8, such that the sacrificial materials 116/118 are contained in trenches and portions of the sacrificial material 116/118 are between portions of the metal oxide material 148, as shown in FIG. 10B. In some embodiments, the metal oxide material 148 may be deposited on the assembly of FIG. 9, and then the resulting assembly may be planarized (e.g., by CMP) to remove the overburden of metal oxide material 148. The metal oxide material 148 may include any suitable metal oxide, such as aluminum oxide.

FIG. 11 illustrates an assembly subsequent to replacing the sacrificial materials 116/118 from the assembly of FIG. 10 with conductive contacts 108/128, respectively, and then planarizing the resulting assembly to remove everything above top surface of the lower structure 102. The sacrificial materials 116/118 may be removed using any suitable selective etch technique(s), and materials for the conductive contacts 108/128 may be deposited over the resulting assembly before planarization. In some embodiments, the conductive contacts 108/128 may have a same material composition, while in other embodiments, the conductive contacts 108 may have a different material composition than the conductive contacts 128 (and thus may be formed using different sets of deposition/masking operations).

FIG. 12 illustrates an assembly subsequent to forming a replication brush 192 on the assembly of FIG. 11, depositing a BCP on the replication brush 192, and treating the resulting assembly to cause the BCP to self-assemble into a first BCP component 117 and a second BCP component 119 in accordance with the template provided by the replication brush 192. As used herein, a "brush" may refer to any material that facilitates the self-assembly of a DSA material thereon, and may include large polymers, small polymers, self-assembled monolayers (SAMs), and other suitable materials. The replication brush 192 may include a first replication brush component 156 and a second replication brush component 158. The first replication brush component 156 may contact the conductive contacts 108/128 and the metal oxide material 148, and the second replication brush component 158 may contact the dielectric material of the lower structure 102 to form the replication brush 192. In some embodiments, the first replication brush component 156 may preferentially attach to metals/metal oxides; in some such embodiments, the first replication brush component 156 may be deposited on the assembly of FIG. 11, and the resulting assembly may be baked and then rinsed to remove any of the first replication brush component 156 that has not bonded to the conductive contacts 108/128 and the metal oxide material 148. Next, the second replication brush component 158 may be deposited. In some embodiments, the second replication brush component 158 may preferentially attach to dielectric materials, while in other embodiments, the second replication brush component 158 may be a "non-selective brush" that does not preferentially attach to dielectric materials, instead grafts to any areas not already covered by the first replication brush component 156. After depositing the second replication brush component 158, the resulting assembly may be baked and then rinsed to remove any excess second replication brush component 158. The replication brush 192 may also include the unordered lamellar region 132, which may have an unordered lamellar structure like that of FIG. 10 and may include materials having a same material composition as the first replication brush component 156 and the second replication brush component 158. In some embodiments, the first replication brush component 156 (a metal/metal oxide-selective brush material) may have a surface anchoring group including phosphines, thiol, thiolate, thioacetate, disulfide, alkyl azide, aryl azide, nitrile, phosphate, silyl, alkyl and other phosphonate ester, phosphonamide, sulfonamides, sulfenate, sulfinate, sulfonate, boronic acid, phosphonic acids, carboxylic acids, phosphorous dichloride, alkenes or alkyne material. In some embodiments, the second replication brush component 158 (a non-selective brush material) may have a surface anchoring group of hydroxyl, amines, or a carboxylic acid group.

As noted above, the self-assembly of the BCP may result in the self-segregation of a first BCP component 117 and a second BCP component 119 of the BCP, as shown in FIG. 12. For ease of discussion, the DSA-based techniques disclosed herein may refer to a BCP having two components, a first BCP component 117 and a second BCP component 119, but this is simply illustrative, and a BCP having more than two components may be utilized in any of the techniques disclosed herein. One example of a BCP that may serve as the BCP in the operations disclosed herein is polystyrene-co-poly(methyl methacrylate) (PS-PMMA); when the BCP is PS-PMMA, the first BCP component 117 may be polystyrene (PS) while the second BCP component 119 may be polymethyl methacrylate (PMMA). In the particular embodiment of FIG. 12, the self-assembly of the BCP includes the BCP self-segregating its first BCP component 117 and second BCP component 119 into bands, forming alternating vertically oriented regions of the first BCP component 117 and the second BCP component 119. The dimensions and spacing of the replication brush 192 may be selected to correspond with the size and spacing of the bands of the first BCP component 117 and the second BCP component 119 of the BCP, as shown, so that the replication brush 192 provides a "template" for the self-assembly of the BCP, aligning the self-assembled BCP as desired with respect to the underlying replication brush 192. A BCP may be able to "stretch" or "shrink" around a nominal "inherent" spacing of the self-assembled bands of the first BCP component 117/second BCP component 119, allowing a range of dimensions of the self-assembled bands of the first BCP component 117/second BCP component 119. The particular band-like self-assembly illustrated in FIG. 12 is one example of a pattern into which a BCP may self-assemble; some BCPs may self-assemble into other patterns, and various BCPs may self-assemble into multiple different patterns under different conditions. The unordered lamellar regions 132 of the replication brush 192 may not provide a surface on which the BCP readily self-assembles into alternating vertically oriented regions of the first BCP component 117 and the second BCP component 119, and so instead, the BCP above the unordered lamellar regions 132 may self-assemble into unordered lamellar regions 123 of the first BCP component 117 and the second BCP component 119; the unordered lamellar regions 123 may have a structure like that illustrated in FIG. 10.

FIG. 13 illustrates an assembly subsequent to removing the first BCP component 117 and the first replication brush component 156 from the assembly of FIG. 12 (e.g., using suitable selective etch techniques). The removal of the first BCP component 117 may result in the unordered lamellar region 123 becoming an unordered lamellar region 127 that includes material having a same material composition as the second replication brush component 119 (and does not include material having a same material composition as the first BCP component 117), and the removal of the first replication brush component 156 may result in the unordered lamellar region 132 becoming an unordered lamellar region 129 that includes material having a same material composition as the second replication brush component 158 (and does not include material having a same material composition as the first replication brush component 156).

FIG. 14 illustrates an assembly subsequent to providing a dielectric material 103 to the assembly of FIG. 13 in the volumes previously occupied by the first replication brush component 156 and the first BCP component 117. In some embodiments, the dielectric material 103 may include silicon oxide. The deposition of the dielectric material 103 may result in the unordered lamellar region 127 becoming an unordered lamellar region 115 that includes material having a same material composition as the second replication brush component 119 and material having a same material composition as the dielectric material 103, and may result in the unordered lamellar region 129 becoming an unordered lamellar region 133 that includes material having a same material composition as the second replication brush component 158 and material having a same material composition as the dielectric material 103. The dielectric material 103 may be on the conductive contacts 108/128, with the sidewalls of the conductive contacts 108/128 aligned with corresponding sidewalls of the portions of dielectric material 103 (i.e., the conductive contacts 108/128 and the portions of dielectric material 103 may be "self-aligned" due to the DSA technique used to pattern the location of the dielectric material 103).

Figure 15A:
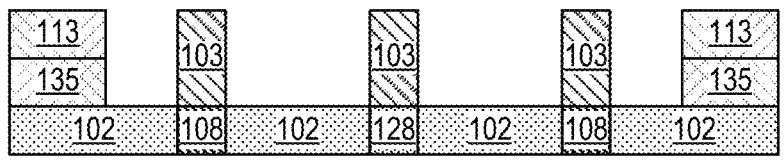
Figure 15B:
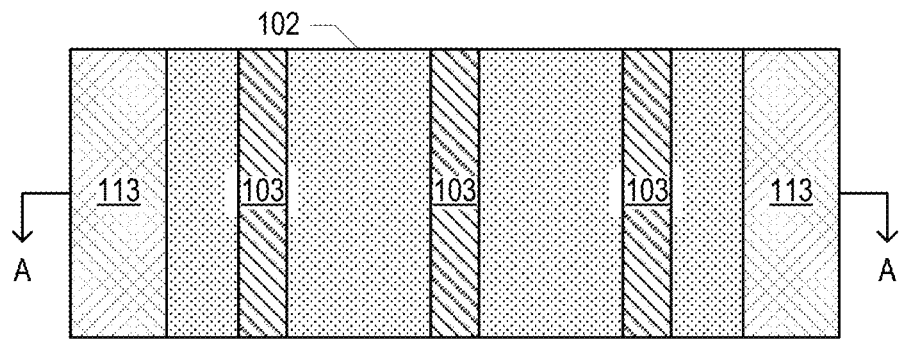

FIG. 15 illustrates an assembly subsequent to removing the second BCP component 119 and the second replication brush component 158 from the assembly of FIG. 14 (e.g., using suitable selective etch techniques). The removal of the second BCP component 119 may result in the unordered lamellar region 115 becoming an unordered lamellar region 113 that includes material having a same material composition as the dielectric material 103 (and does not include material having a same material composition as the second BCP component 119), and the removal of the second replication brush component 158 may result in the unordered lamellar region 133 becoming an unordered lamellar region 135 that includes material having a same material composition as the dielectric material 103 (and does not include material having a same material composition as the second replication brush component 158).

Figure 16A:
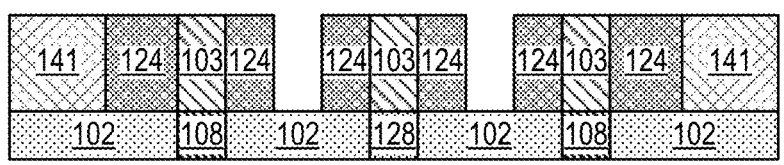
Figure 16B:
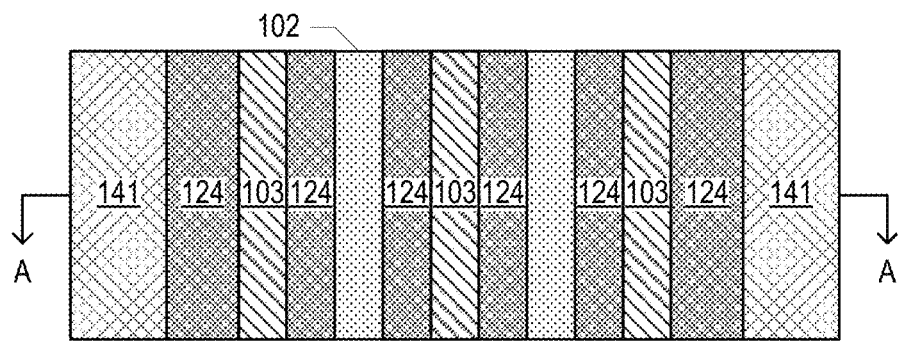

FIG. 16 illustrates an assembly subsequent to forming first spacers 124 on side faces of the dielectric material 103 of the assembly of FIG. 15. The first spacers 124 may include a dielectric material (e.g., as discussed above), and may be fabricated using any suitable spacer technique (e.g., a conformal deposition of the dielectric material, such as by atomic layer deposition (ALD), followed by a "downward" directional etch to remove the dielectric material on horizontal surfaces and leave the dielectric material in place on side faces). The deposition of the first spacers 124 may result in the unordered lamellar regions 113 and 135 becoming an unordered lamellar region 141 that includes material having a same material composition as the dielectric material 103 and material having a same material composition as the first spacers 124.

Figure 17A:
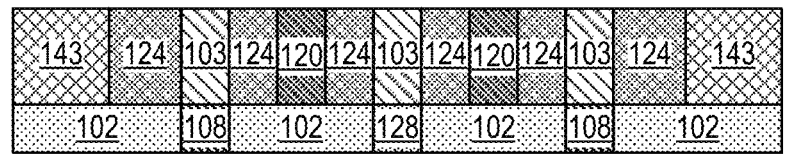
Figure 17B:
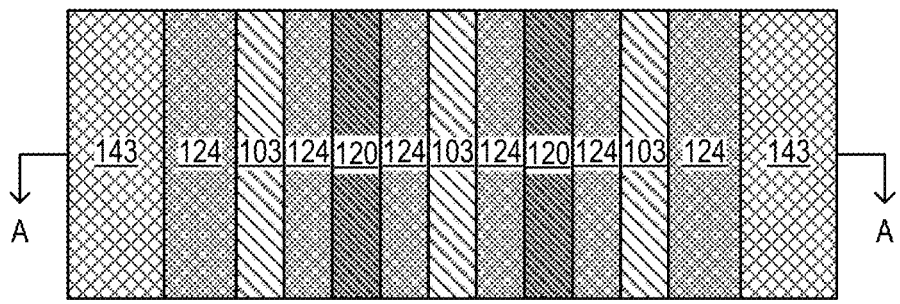

FIG. 17 illustrates an assembly subsequent to forming second conductive structures 120 in the openings between pairs of first spacers 124 in the assembly of FIG. 16. The second conductive structures 120 may be formed using any suitable deposition technique(s) and may be followed by a planarization operation (e.g., using CMP). The formation of the second conductive structures 120 may result in the unordered lamellar region 141 becoming the first unordered lamellar region 143 that includes material having a same material composition as the dielectric material 103, material having a same material composition as the first spacers 124, and material having a same material composition as the second conductive structures 120.

Figure 18A:
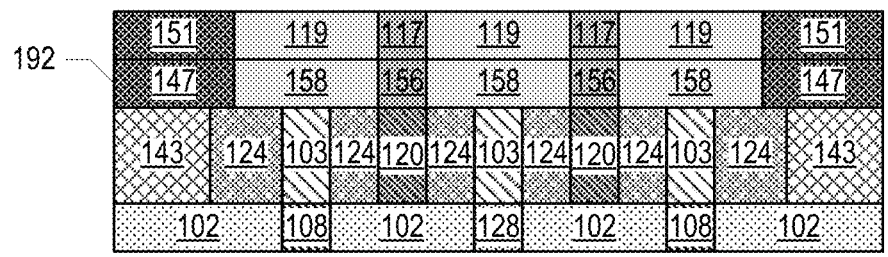
Figure 18B:
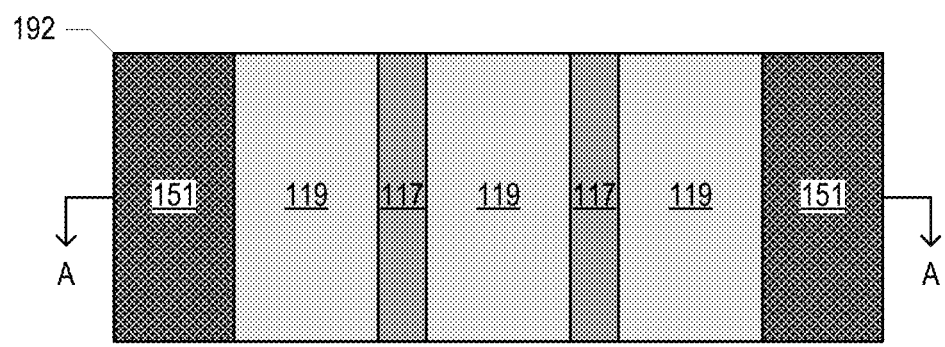

FIG. 18 illustrates an assembly subsequent to forming a replication brush 192 (including a first replication brush component 156 and a second replication brush component 158) on the assembly of FIG. 17, depositing a BCP on the replication brush 192, and treating the resulting assembly to cause the BCP to self-assemble into a first BCP component 117 and a second BCP component 119 in accordance with the template provided by the replication brush 192. The operations discussed with reference to FIG. 18 may take any suitable form (e.g., any of the forms discussed above with reference to FIG. 12). For example, as discussed above with reference to FIG. 12, the first replication brush component 156 may preferentially attach to metal/metal oxides (and thus may preferentially attach to the second conductive structures 120) and the second replication brush component 158 may attach to any remaining exposed material (and thus may attach to the first spacers 124 and the dielectric material 103) to form a self-assembled replication brush 192. The replication brush 192 may also include the unordered lamellar region 147, which may have an unordered lamellar structure like that of FIG. 10 and may include materials having a same material composition as the first replication brush component 156 and the second replication brush component 158. The BCP above the unordered lamellar regions 147 may self-assemble into unordered lamellar regions 151 of the first BCP component 117 and the second BCP component 119; the unordered lamellar regions 151 may have a structure like that illustrated in FIG. 10.

Figure 19A:
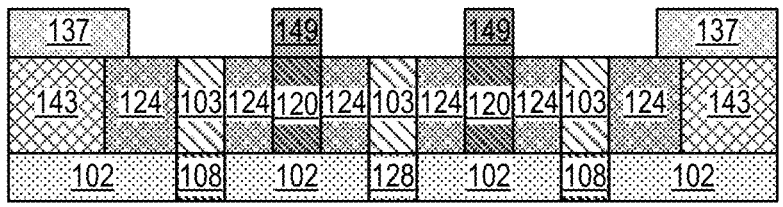
Figure 19B:
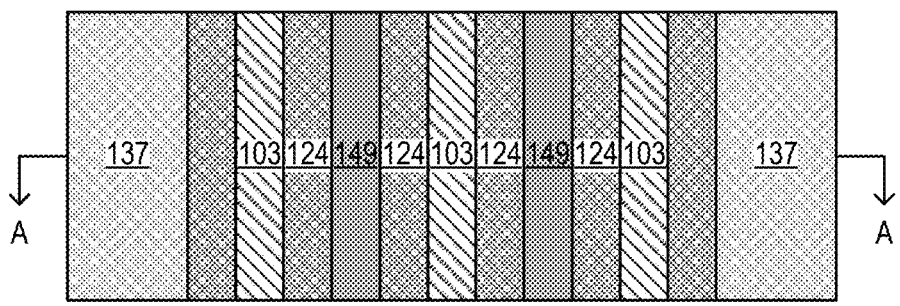

FIG. 19 illustrates an assembly subsequent to replacing the first BCP component 117 and the first replication brush component 156 of the assembly of FIG. 18 with a material of the cap structures 149, planarizing the result (e.g., using CMP), and then removing the second BCP component 119 and the second replication brush component 158, leaving the cap structures 149 in place over the second conductive structures 120. Any suitable selective etch and deposition techniques may be used. The cap structures 149 may be on the second conductive structures 120, with the sidewalls of the second conductive structures 120 aligned with corresponding sidewalls of the cap structures 149 (i.e., the second conductive structures 120 and the cap structures 149 may be "self-aligned" due to the DSA technique used to pattern the location of the cap structures 149). The formation of the cap structures 149 may result in the unordered lamellar regions 151 and 147 becoming an unordered lamellar region 137 that includes material having a same material composition as the cap structures 149.

Figure 20A:
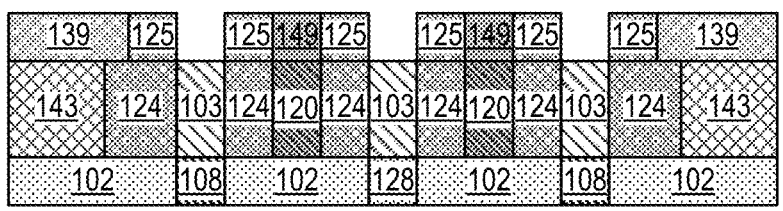
Figure 20B:
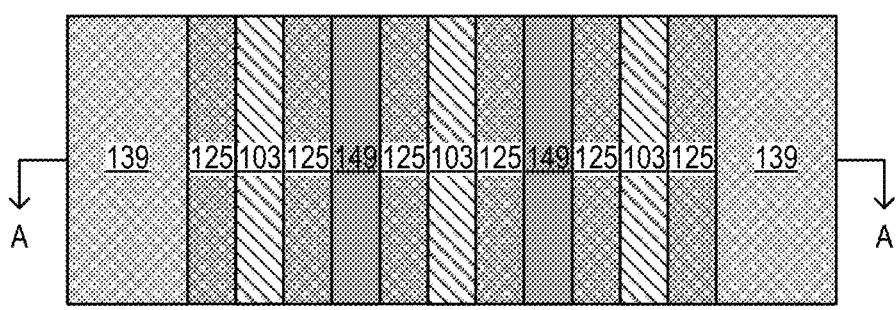

FIG. 20 illustrates an assembly subsequent to forming second spacers 125 on side faces of the cap structures 149 of the assembly of FIG. 19. The second spacers 125 may include a dielectric material (e.g., as discussed above), and may be fabricated using any suitable spacer technique (e.g., as discussed above with reference to FIG. 16). The deposition of the second spacers 125 may result in the unordered lamellar region 137 becoming an unordered lamellar region 139 that includes material having a same material composition as the cap structures 149 and material having a same material composition as the second spacers 125.

Figure 21A:
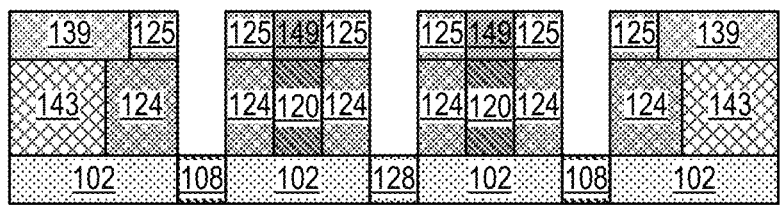
Figure 21B:
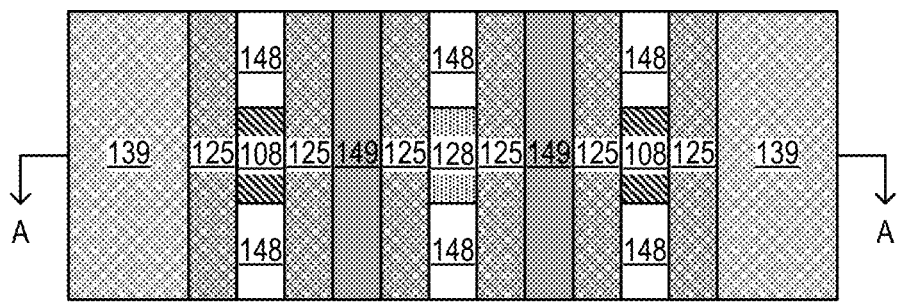

FIG. 21 illustrates an assembly subsequent to removing the dielectric material 103 from the assembly of FIG. 20. Any suitable selective etch techniques may be used. The trenches resulting from the removal of the dielectric material 103 may be self-aligned with the conductive contacts 108/128, as discussed above.

Figure 22A:
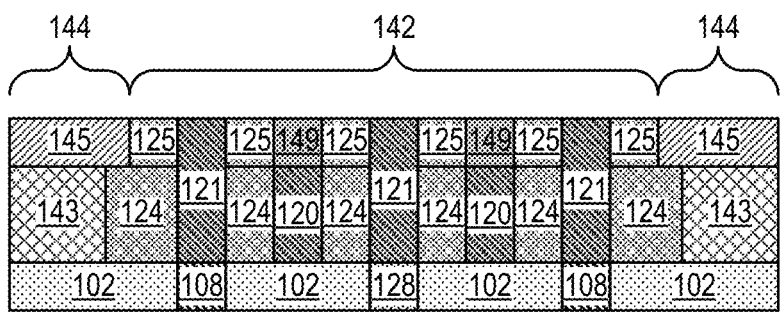
Figure 22B:
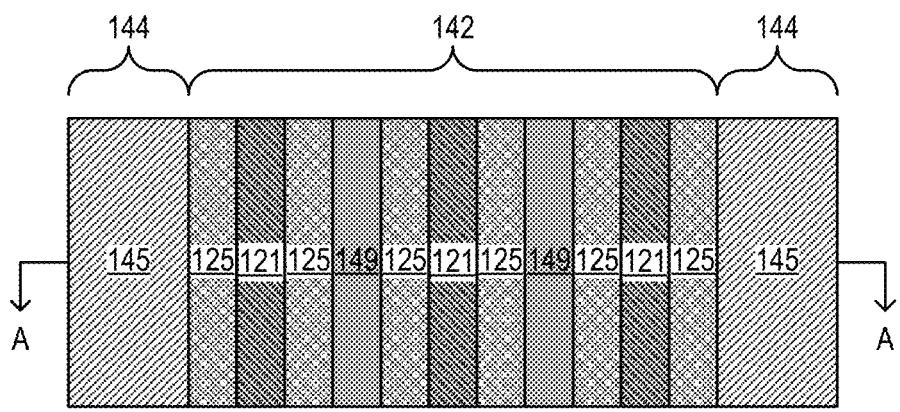

FIG. 22 illustrates an assembly subsequent to forming the first conductive structures 121 in the trenches in the assembly of FIG. 21. The first conductive structures 121 may be formed using any suitable deposition technique(s) and may be followed by a planarization operation (e.g., using CMP). The formation of the first conductive structures 121 may result in the unordered lamellar region 139 becoming the second unordered lamellar region 145 that includes material having a same material composition as the cap structures 149, material having a same material composition as the second spacers 125, and material having a same material composition as the first conductive structures 121. As discussed above with reference to FIG. 14, the first conductive structures 121 may be on the conductive contacts 108/128, with the sidewalls of the conductive contacts 108/128 aligned with corresponding sidewalls of the first conductive structures 121 (i.e., the conductive contacts 108/128 and the first conductive structures 121 may be "self-aligned" due to the DSA techniques used to pattern the location of the first conductive structures 121). The assembly of FIG. 22 may take the form of the microelectronic structure 100 of FIG. 1. Subsequent manufacturing operations may be performed on the assembly of FIG. 22 (e.g., additional metallization layers may be formed, as discussed further below).

The microelectronic structures 100 disclosed herein may be included in any suitable electronic component. FIGS. 23-27 illustrate various examples of apparatuses that may include any of the microelectronic structures 100 disclosed herein.

Figure 23:
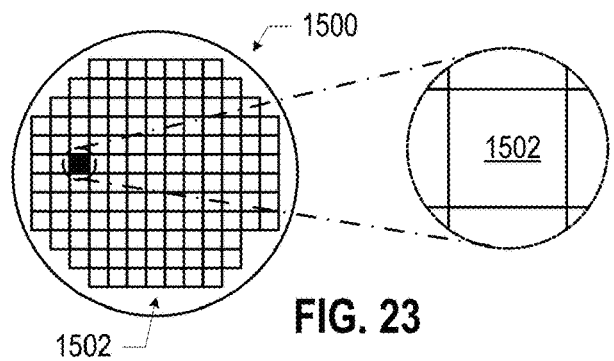
FIG. 23 is a top view of a wafer and dies that may include any of the microelectronic structures disclosed herein.

FIG. 23 is a top view of a wafer 1500 and dies 1502 that may include one or more microelectronic structures 100 in accordance with any of the embodiments disclosed herein. The wafer 1500 may be composed of semiconductor material and may include one or more dies 1502 having microelectronic structures formed on a surface of the wafer 1500. Each of the dies 1502 may be a repeating unit of a semiconductor product that includes any suitable microelectronic structure. After the fabrication of the semiconductor product is complete, the wafer 1500 may undergo a singulation process in which the dies 1502 are separated from one another to provide discrete "chips" of the semiconductor product. The die 1502 may include one or more microelectronic structures 100 (e.g., as discussed below with reference to FIG. 24), one or more transistors (e.g., some of the transistors 1640 of FIG. 24, discussed below) and/or supporting circuitry to route electrical signals to the transistors, as well as any other circuit components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 27) or other logic that is configured to store information in the memory devices or execute instructions stored in the memory array.

Figure 24:
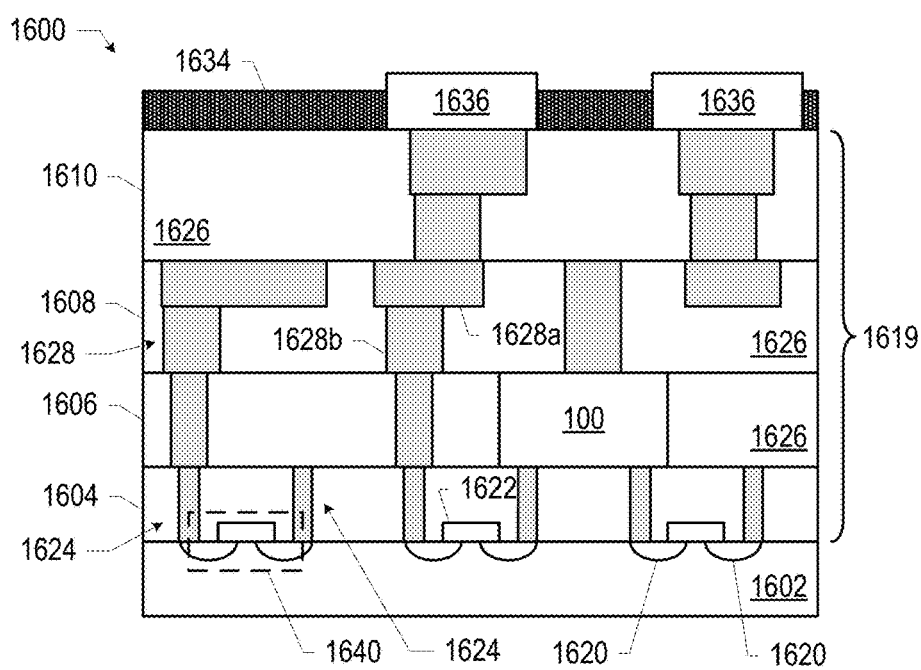
FIG. 24 is a side, cross-sectional view of a microelectronic device that may include any of the microelectronic structures disclosed herein.

FIG. 24 is a side, cross-sectional view of a microelectronic device 1600 that may include one or more microelectronic structures 100 in accordance with any of the embodiments disclosed herein. One or more of the microelectronic devices 1600 may be included in one or more dies 1502 (FIG. 23). The microelectronic device 1600 may be formed on a substrate 1602 (e.g., the wafer 1500 of FIG. 23) and may be included in a die (e.g., the die 1502 of FIG. 23). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for a microelectronic device 1600 may be used. The substrate 1602 may be part of a singulated die (e.g., the dies 1502 of FIG. 23) or a wafer (e.g., the wafer 1500 of FIG. 23).

The microelectronic device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 24 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more metallization layers disposed on the device layer 1604 (illustrated in FIG. 24 as metallization layers 1606-1610). For example, conductive features of the device layer 1604 (e.g., the gate 1622 and the S/D contacts 1624) may be electrically coupled with the interconnect structures 1628 of the metallization layers 1606-1610. The one or more metallization layers 1606-1610 may form a metallization stack (also referred to as an "ILD stack") 1619 of the microelectronic device 1600. FIG. 24 illustrates a microelectronic structure 100 included in the "M0" metallization layer 1606 of the metallization stack 1619, but this is simply illustrative, and any of the microelectronic structures 100 disclosed herein may be included in any of the metallization layers of a metallization stack 1619, as desired.

The interconnect structures 1628 may be arranged within the metallization layers 1606-1610 to route electrical signals according to a wide variety of designs (in particular, the arrangement is not limited to the particular configuration of interconnect structures 1628 depicted in FIG. 24). Although a particular number of metallization layers 1606-1610 is depicted in FIG. 24, embodiments of the present disclosure include microelectronic devices having more or fewer metallization layers than depicted.

In some embodiments, the interconnect structures 1628 may include lines 1628a and/or vias 1628b filled with a conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 24. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different metallization layers 1606-1610 together.

The metallization layers 1606-1610 may include a dielectric material 1626 disposed between the interconnect structures 1628, as shown in FIG. 24. In some embodiments, the dielectric material 1626 disposed between the interconnect structures 1628 in different ones of the metallization layers 1606-1610 may have different compositions; in other embodiments, the composition of the dielectric material 1626 between different metallization layers 1606-1610 may be the same.

A first metallization layer 1606 may be formed above the device layer 1604. In some embodiments, the first metallization layer 1606 may include lines 1628a and/or vias 1628b, as shown. The lines 1628a of the first metallization layer 1606 may be coupled with contacts (e.g., the S/D contacts 1624) of the device layer 1604. The first metallization layer 1606 may be referred to as the "M0" metallization layer. In some embodiments, the M0 metallization layer may include any suitable portion of any of the microelectronic structures 100 disclosed herein.

A second metallization layer 1608 may be formed above the first metallization layer 1606. In some embodiments, the second metallization layer 1608 may include vias 1628b to couple the lines 1628a of the second metallization layer 1608 with the lines 1628a of the first metallization layer 1606. Although the lines 1628a and the vias 1628b are structurally delineated with a line within each metallization layer (e.g., within the second metallization layer 1608) for the sake of clarity, the lines 1628a and the vias 1628b may be structurally and/or materially contiguous (e.g., simultaneously filled during a dual-damascene process) in some embodiments. The second metallization layer 1608 may be referred to as the "M1" metallization layer. In some embodiments, the M1 metallization layer may include any suitable portion of any of the microelectronic structures 100 disclosed herein.

A third metallization layer 1610 (and additional metallization layers, as desired) may be formed in succession on the second metallization layer 1608 according to similar techniques and configurations described in connection with the second metallization layer 1608 or the first metallization layer 1606. The third metallization layer 1610 may be referred to as the "M2" metallization layer. In some embodiments, the M2 metallization layer may include any suitable portion of any of the microelectronic structures 100 disclosed herein. In some embodiments, the metallization layers that are "higher up" in the metallization stack 1619 in the microelectronic device 1600 (i.e., farther away from the device layer 1604) may be thicker.

The microelectronic device 1600 may include a solder resist material 1634 (e.g., polyimide or similar material) and one or more conductive contacts 1636 formed on the metallization layers 1606-1610. In FIG. 24, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the microelectronic device 1600 with another component (e.g., a circuit board). The microelectronic device 1600 may include additional or alternate structures to route the electrical signals from the metallization layers 1606-1610; for example, the conductive contacts 1636 may include other analogous features (e.g., posts) that route the electrical signals to external components.

Figure 25:
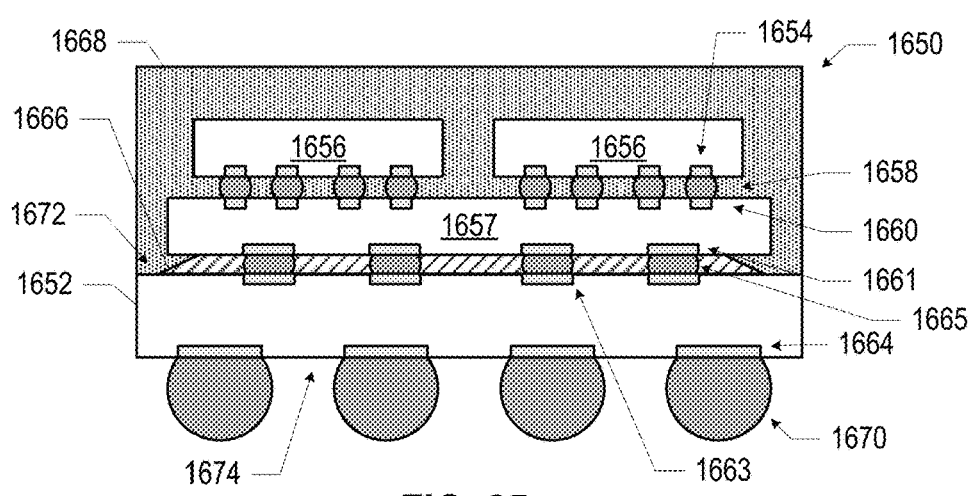
FIG. 25 is a side, cross-sectional view of a microelectronic package that may include any of the microelectronic structures disclosed herein.

FIG. 25 is a side, cross-sectional view of an example microelectronic package 1650 that may include one or more microelectronic structures 100 in accordance with any of the embodiments disclosed herein. In some embodiments, the microelectronic package 1650 may be a system-in-package (SiP).

The package substrate 1652 may be formed of a dielectric material (e.g., a ceramic, a buildup film, an epoxy film having filler particles therein, glass, an organic material, an inorganic material, combinations of organic and inorganic materials, embedded portions formed of different materials, etc.), and may have conductive pathways extending through the dielectric material between the face 1672 and the face 1674, or between different locations on the face 1672, and/or between different locations on the face 1674. These conductive pathways may take the form of any of the interconnect structures 1628 discussed above with reference to FIG. 24.

The package substrate 1652 may include conductive contacts 1663 that are coupled to conductive pathways (not shown) through the package substrate 1652, allowing circuitry within the dies 1656 and/or the interposer 1657 to electrically couple to various ones of the conductive contacts 1664 (or to other devices included in the package substrate 1652, not shown).

The microelectronic package 1650 may include an interposer 1657 coupled to the package substrate 1652 via conductive contacts 1661 of the interposer 1657, first-level interconnects 1665, and the conductive contacts 1663 of the package substrate 1652. The first-level interconnects 1665 illustrated in FIG. 25 are solder bumps, but any suitable first-level interconnects 1665 may be used. In some embodiments, no interposer 1657 may be included in the microelectronic package 1650; instead, the dies 1656 may be coupled directly to the conductive contacts 1663 at the face 1672 by first-level interconnects 1665. More generally, one or more dies 1656 may be coupled to the package substrate 1652 via any suitable structure (e.g., (e.g., a silicon bridge, an organic bridge, one or more waveguides, one or more interposers, wirebonds, etc.).

The microelectronic package 1650 may include one or more dies 1656 coupled to the interposer 1657 via conductive contacts 1654 of the dies 1656, first-level interconnects 1658, and conductive contacts 1660 of the interposer 1657. The conductive contacts 1660 may be coupled to conductive pathways (not shown) through the interposer 1657, allowing circuitry within the dies 1656 to electrically couple to various ones of the conductive contacts 1661 (or to other devices included in the interposer 1657, not shown). The first-level interconnects 1658 illustrated in FIG. 25 are solder bumps, but any suitable first-level interconnects 1658 may be used. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

In some embodiments, an underfill material 1666 may be disposed between the package substrate 1652 and the interposer 1657 around the first-level interconnects 1665, and a mold compound 1668 may be disposed around the dies 1656 and the interposer 1657 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 25 are solder balls (e.g., for a ball grid array arrangement), but any suitable second-level interconnects 16770 may be used (e.g., pins in a pin grid array arrangement or lands in a land grid array arrangement). The second-level interconnects 1670 may be used to couple the microelectronic package 1650 to another component, such as a circuit board (e.g., a motherboard), an interposer, or another microelectronic package, as known in the art and as discussed below with reference to FIG. 26.

The dies 1656 may take the form of any of the embodiments of the die 1502 discussed herein (e.g., may include any of the embodiments of the microelectronic device 1600). In embodiments in which the microelectronic package 1650 includes multiple dies 1656, the microelectronic package 1650 may be referred to as a multi-chip package (MCP). The dies 1656 may include circuitry to perform any desired functionality. For example, or more of the dies 1656 may be logic dies (e.g., silicon-based dies), and one or more of the dies 1656 may be memory dies (e.g., high bandwidth memory).

Although the microelectronic package 1650 illustrated in FIG. 25 is a flip chip package, other package architectures may be used. For example, the microelectronic package 1650 may be a ball grid array (BGA) package, such as an embedded wafer-level ball grid array (eWLB) package. In another example, the microelectronic package 1650 may be a wafer-level chip scale package (WLCSP) or a panel fanout (FO) package. Although two dies 1656 are illustrated in the microelectronic package 1650 of FIG. 25, a microelectronic package 1650 may include any desired number of dies 1656. A microelectronic package 1650 may include additional passive components, such as surface-mount resistors, capacitors, and inductors disposed on the first face 1672 or the second face 1674 of the package substrate 1652, or on either face of the interposer 1657. More generally, a microelectronic package 1650 may include any other active or passive components known in the art.

Figure 26:
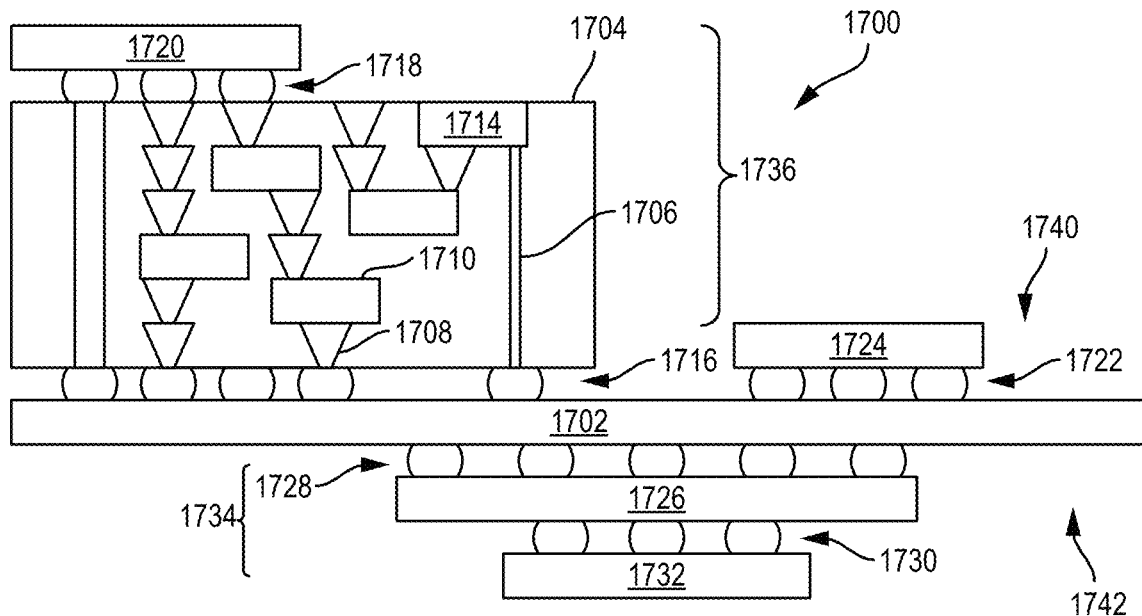
FIG. 26 is a side, cross-sectional view of a microelectronic device assembly that may include any of the microelectronic structures disclosed herein.

FIG. 26 is a side, cross-sectional view of a microelectronic device assembly 1700 that may include one or more microelectronic packages or other electronic components (e.g., a die) including one or more microelectronic structures 100 in accordance with any of the embodiments disclosed herein. The microelectronic device assembly 1700 includes a number of components disposed on a circuit board 1702 (which may be, e.g., a motherboard). The microelectronic device assembly 1700 includes components disposed on a first face 1740 of the circuit board 1702 and an opposing second face 1742 of the circuit board 1702; generally, components may be disposed on one or both faces 1740 and 1742. Any of the microelectronic packages discussed below with reference to the microelectronic device assembly 1700 may take the form of any of the embodiments of the microelectronic package 1650 discussed above with reference to FIG. 25 (e.g., may include one or more microelectronic structures 100 in a die).

In some embodiments, the circuit board 1702 may be a printed circuit board (PCB) including multiple metal layers separated from one another by layers of dielectric material and interconnected by conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The microelectronic device assembly 1700 illustrated in FIG. 26 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 26), male and female portions of a socket, an adhesive, an underfill material, and/or any other suitable electrical and/or mechanical coupling structure.

The package-on-interposer structure 1736 may include a microelectronic package 1720 coupled to an package interposer 1704 by coupling components 1718. The coupling components 1718 may take any suitable form for the application, such as the forms discussed above with reference to the coupling components 1716. Although a single microelectronic package 1720 is shown in FIG. 26, multiple microelectronic packages may be coupled to the package interposer 1704; indeed, additional interposers may be coupled to the package interposer 1704. The package interposer 1704 may provide an intervening substrate used to bridge the circuit board 1702 and the microelectronic package 1720. The microelectronic package 1720 may be or include, for example, a die (the die 1502 of FIG. 23), a microelectronic device (e.g., the microelectronic device 1600 of FIG. 24), or any other suitable component. Generally, the package interposer 1704 may spread a connection to a wider pitch or reroute a connection to a different connection. For example, the package interposer 1704 may couple the microelectronic package 1720 (e.g., a die) to a set of BGA conductive contacts of the coupling components 1716 for coupling to the circuit board 1702. In the embodiment illustrated in FIG. 26, the microelectronic package 1720 and the circuit board 1702 are attached to opposing sides of the package interposer 1704; in other embodiments, the microelectronic package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The microelectronic device assembly 1700 may include a microelectronic package 1724 coupled to the first face 1740 of the circuit board 1702 by coupling components 1722. The coupling components 1722 may take the form of any of the embodiments discussed above with reference to the coupling components 1716, and the microelectronic package 1724 may take the form of any of the embodiments discussed above with reference to the microelectronic package 1720.

The microelectronic device assembly 1700 illustrated in FIG. 26 includes a package-on-package structure 1734 coupled to the second face 1742 of the circuit board 1702 by coupling components 1728. The package-on-package structure 1734 may include a microelectronic package 1726 and a microelectronic package 1732 coupled together by coupling components 1730 such that the microelectronic package 1726 is disposed between the circuit board 1702 and the microelectronic package 1732. The coupling components 1728 and 1730 may take the form of any of the embodiments of the coupling components 1716 discussed above, and the microelectronic packages 1726 and 1732 may take the form of any of the embodiments of the microelectronic package 1720 discussed above. The package-on-package structure 1734 may be configured in accordance with any of the package-on-package structures known in the art.

Figure 27:
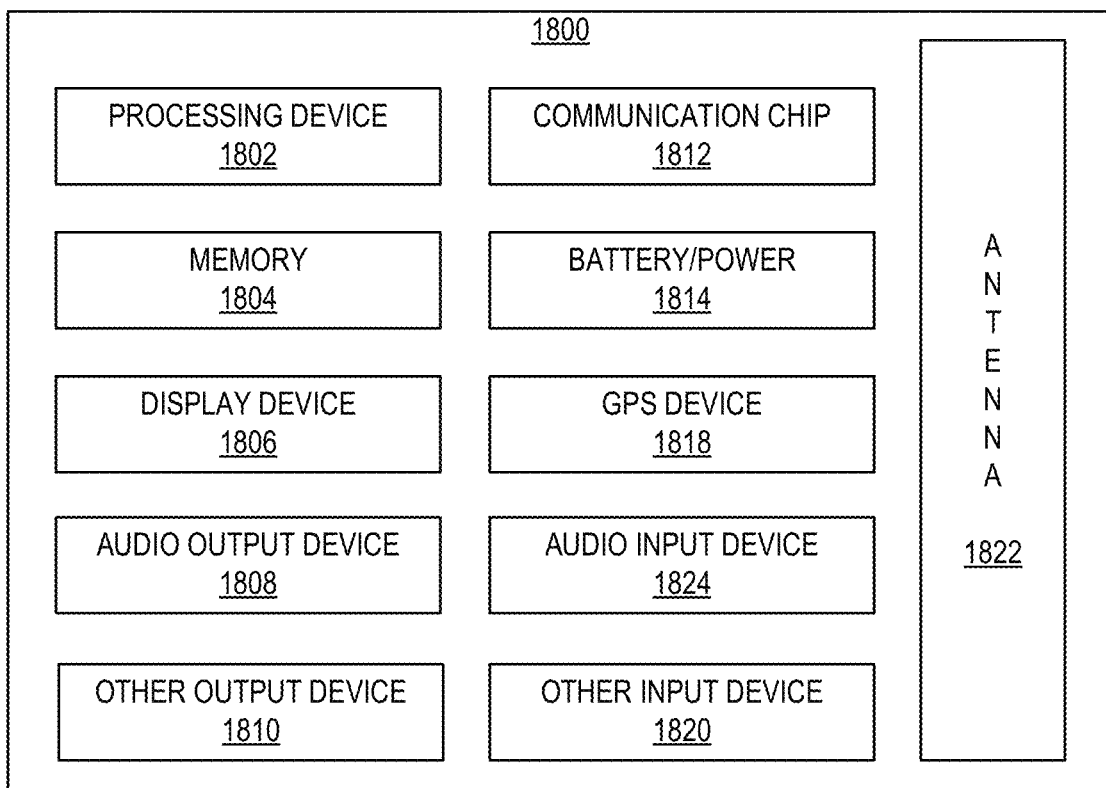
FIG. 27 is a block diagram of an example computing device that may include any of the microelectronic structures disclosed herein.

FIG. 27 is a block diagram of an example computing device 1800 that may include one or more microelectronic structures 100 in accordance with any of the embodiments disclosed herein. For example, any suitable ones of the components of the computing device 1800 may include one or more of the microelectronic device assemblies 1700, microelectronic packages 1650, microelectronic devices 1600, or dies 1502 disclosed herein. A number of components are illustrated in FIG. 27 as included in the computing device 1800, but any one or more of these components may be omitted or duplicated, as suitable for the application. In some embodiments, some or all of the components included in the computing device 1800 may be attached to one or more motherboards. In some embodiments, some or all of these components are fabricated onto a single system-on-a-chip (SoC) die.

Additionally, in various embodiments, the computing device 1800 may not include one or more of the components illustrated in FIG. 27, but the computing device 1800 may include interface circuitry for coupling to the one or more components. For example, the computing device 1800 may not include a display device 1806, but may include display device interface circuitry (e.g., a connector and driver circuitry) to which a display device 1806 may be coupled. In another set of examples, the computing device 1800 may not include an audio input device 1824 or an audio output device 1808, but may include audio input or output device interface circuitry (e.g., connectors and supporting circuitry) to which an audio input device 1824 or audio output device 1808 may be coupled.

The computing device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the computing device 1800 may include a communication chip 1812 (e.g., one or more communication chips). For example, the communication chip 1812 may be configured for managing wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The computing device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The computing device 1800 may include battery/power circuitry 1814. The battery/power circuitry 1814 may include one or more energy storage devices (e.g., batteries or capacitors) and/or circuitry for coupling components of the computing device 1800 to an energy source separate from the computing device 1800 (e.g., AC line power).

The computing device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The computing device 1800 may include an audio output device 1808 (or corresponding interface circuitry, as discussed above). The audio output device 1808 may include any device that generates an audible indicator, such as speakers, headsets, or earbuds.

The computing device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The computing device 1800 may include a GPS device 1818 (or corresponding interface circuitry, as discussed above). The GPS device 1818 may be in communication with a satellite-based system and may receive a location of the computing device 1800, as known in the art.

The computing device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The computing device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1800 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop computing device, a server computing device or other networked computing component, a vehicle computing device (e.g., a vehicle control unit), a laptop computing device, a printer, a scanner, a monitor, a set-top box, an entertainment control unit, a digital camera, a digital video recorder, or a wearable computing device. In some embodiments, the computing device 1800 may be any other electronic device that processes data.

The following paragraphs provide various examples of the embodiments disclosed herein.

Example 1 is a microelectronic structure, including: a metallization layer including a conductive structure; a first unordered lamellar region laterally spaced apart from and aligned with a bottom portion of the conductive structure; and a second unordered lamellar region above the first unordered lamellar region, wherein the second unordered lamellar region is laterally spaced apart from and aligned with a top portion of the conductive structure.

Example 2 includes the subject matter of Example 1, and further specifies that the first unordered lamellar region has a different unordered lamellar pattern than the second unordered lamellar region.

Example 3 includes the subject matter of any of Examples 1-2, and further specifies that the metallization layer includes first spacer portions adjacent to the bottom portion of the conductive structure, and the first unordered lamellar region includes material having a same material composition as the first spacer portions.

Example 4 includes the subject matter of any of Examples 1-3, and further specifies that the metallization layer includes second spacer portions adjacent to the top portion of the conductive structure, and the second unordered lamellar region includes material having a same material composition as the second spacer portions.

Example 5 includes the subject matter of Example 4, and further specifies that the material is a first material, the second unordered lamellar region includes a second material different from the first material, and the second material is a dielectric material.

Example 6 includes the subject matter of any of Examples 1-5, and further specifies that the second unordered lamellar region includes material having a same material composition as the conductive structure.

Example 7 includes the subject matter of any of Examples 1-6, and further specifies that the conductive structure is a first conductive structure, the metallization layer includes a second conductive structure, the second conductive structure is laterally spaced apart from and aligned with the bottom portion of the first conductive structure, the metallization layer includes a cap structure above the second conductive structure, and the cap structure is laterally spaced apart from and aligned with the top portion of the first conductive structure.

Example 8 includes the subject matter of Example 7, and further specifies that the first unordered lamellar region includes material having a same material composition as the second conductive structure.

Example 9 includes the subject matter of any of Examples 7-8, and further specifies that the second unordered lamellar region includes material having a same material composition as the cap structure.

Example 10 includes the subject matter of any of Examples 7-9, and further specifies that the cap structure includes silicon and nitrogen.

Example 11 includes the subject matter of any of Examples 7-10, and further specifies that the metallization layer includes first spacer portions adjacent to the bottom portion of the conductive structure, and a first spacer portion is between the first conductive structure and the second conductive structure.

Example 12 includes the subject matter of any of Examples 7-11, and further specifies that the metallization layer includes second spacer portions adjacent to the top portion of the conductive structure, and a second spacer portion is between the first conductive structure and the cap structure.

Example 13 includes the subject matter of any of Examples 1-12, and further specifies that the conductive structure has straight sidewalls.

Example 14 includes the subject matter of any of Examples 1-13, and further includes: a transistor contact; wherein the conductive structure is above and vertically aligned with the transistor contact.

Example 15 includes the subject matter of Example 14, and further specifies that the transistor contact is a gate contact.

Example 16 includes the subject matter of Example 14, and further specifies that the transistor contact is a source/drain contact.

Example 17 includes the subject matter of any of Examples 14-16, and further specifies that the transistor contact is in a trench, and the trench also includes a metal oxide.

Example 18 includes the subject matter of Example 17, and further specifies that the transistor contact is between a first portion of metal oxide and a second portion of metal oxide in the trench.

Example 19 includes the subject matter of any of Examples 1-18, and further specifies that the metallization layer is an M0 layer.

Example 20 includes the subject matter of any of Examples 1-19, and further includes: a device layer; and additional metallization layers, wherein the metallization layer is between the device layer and the additional metallization layers.

Example 21 includes the subject matter of any of Examples 1-20, and further specifies that the microelectronic structure is part of a die, and the first unordered lamellar region is part of a transition region of the die, under a guard ring of the die, or in a frame of the die.

Example 22 is a microelectronic structure, including: a metallization layer including first conductive structures alternating with second conductive structures; wherein individual ones of the first conductive structures include a bottom portion and a top portion, individual cap structures are on individual ones of the second conductive structures, the bottom portions of the first conductive structures are laterally spaced apart from and aligned with the second conductive structures, and the top portions of the first conductive structures are laterally spaced apart from and aligned with the cap structures.

Example 23 includes the subject matter of Example 22, and further includes: a first unordered lamellar region laterally spaced apart from and aligned with bottom portions of the first conductive structures; and a second unordered lamellar region above the first unordered lamellar region, wherein the second unordered lamellar region is laterally spaced apart from and aligned with top portions of the first conductive structures.

Example 24 includes the subject matter of Example 23, and further specifies that the first unordered lamellar region has a different unordered lamellar pattern than the second unordered lamellar region.

Example 25 includes the subject matter of any of Examples 23-24, and further specifies that the metallization layer includes first spacer portions adjacent to the bottom portions of the first conductive structure, and the first unordered lamellar region includes material having a same material composition as the first spacer portions.

Example 26 includes the subject matter of Example 25, and further specifies that an individual first spacer portion is between an individual first conductive structure and an individual second conductive structure.

Example 27 includes the subject matter of any of Examples 23-26, and further specifies that the metallization layer includes second spacer portions adjacent to the top portions of the first conductive structures, and the second unordered lamellar region includes material having a same material composition as the second spacer portions.

Example 28 includes the subject matter of Example 27, and further specifies that an individual second spacer portion is between an individual first conductive structure and an individual cap structure.

Example 29 includes the subject matter of any of Examples 27-28, and further specifies that the material is a first material, the second unordered lamellar region includes a second material different from the first material, and the second material is a dielectric material.

Example 30 includes the subject matter of any of Examples 23-29, and further specifies that the second unordered lamellar region includes material having a same material composition as the first conductive structures.

Example 31 includes the subject matter of any of Examples 23-30, and further specifies that the first unordered lamellar region includes material having a same material composition as the second conductive structure.

Example 32 includes the subject matter of any of Examples 23-31, and further specifies that the second unordered lamellar region includes material having a same material composition as the cap structure.

Example 33 includes the subject matter of any of Examples 23-33, and further specifies that the microelectronic structure is part of a die, and the first unordered lamellar region is part of a transition region of the die, under a guard ring of the die, or in a frame of the die.

Example 34 includes the subject matter of any of Examples 22-33, and further specifies that the cap structure includes silicon and nitrogen.

Example 35 includes the subject matter of any of Examples 22-34, and further specifies that individual ones of the first conductive structures have straight sidewalls.

Example 36 includes the subject matter of any of Examples 22-35, and further includes: transistor contacts; wherein individual ones of the first conductive structures are above and laterally aligned with individual ones of the transistor contacts.

Example 37 includes the subject matter of Example 36, and further specifies that the transistor contacts include one or more gate contacts.

Example 38 includes the subject matter of Example 36, and further specifies that the transistor contacts include one or more source/drain contacts.

Example 39 includes the subject matter of any of Examples 36-38, and further specifies that the transistor contacts are in trenches, and the trenches also includes a metal oxide.

Example 40 includes the subject matter of Example 39, and further specifies that individual ones of the transistor contacts are between a first portion of metal oxide and a second portion of metal oxide in the trench.

Example 41 includes the subject matter of any of Examples 22-40, and further specifies that the metallization layer is an M0 layer.

Example 42 includes the subject matter of any of Examples 22-41, and further includes: a device layer; and additional metallization layers, wherein the metallization layer is between the device layer and the additional metallization layers.

Example 43 is a computing device, including: a die including a microelectronic structure, wherein the microelectronic structure includes first conductive structures alternating with second conductive structures, individual ones of the first conductive structures include a bottom portion and a top portion, individual cap structures are on individual ones of the second conductive structures, the bottom portions of the first conductive structures are aligned with the second conductive structures, and the top portions of the first conductive structures are aligned with the cap structures; and a circuit board, wherein the die is communicatively coupled to the circuit board.

Example 44 includes the subject matter of Example 43, and further specifies that the first conductive structures and the second conductive structures are aligned with an unordered lamellar region.

Example 45 includes the subject matter of Example 44, and further specifies that the unordered lamellar region is part of a transition region of the die, under a guard ring of the die, or in a frame of the die.

Example 46 includes the subject matter of any of Examples 43-45, and further specifies that the die is included in a package, and the package is communicatively coupled to the circuit board.

Example 47 includes the subject matter of Example 46, and further specifies that the package is communicatively coupled to the circuit board by solder.

Example 48 includes the subject matter of any of Examples 43-47, and further specifies that the circuit board is a motherboard.

Example 49 includes the subject matter of any of Examples 43-48, and further specifies that the die is part of a processing device or a memory device.

Example 50 includes the subject matter of any of Examples 43-49, and further specifies that the computing device is a mobile computing device.

Example 51 includes the subject matter of any of Examples 43-49, and further specifies that the computing device is a laptop computing device.

Example 52 includes the subject matter of any of Examples 43-49, and further specifies that the computing device is a desktop computing device.

Example 53 includes the subject matter of any of Examples 43-49, and further specifies that the computing device is a wearable computing device.

Example 54 includes the subject matter of any of Examples 43-49, and further specifies that the computing device is a server computing device.

Example 55 includes the subject matter of any of Examples 43-49, and further specifies that the computing device is a vehicle computing device.

Example 56 includes the subject matter of any of Examples 43-55, and further specifies that the computing device further includes a display communicatively coupled to the circuit board.

Example 57 includes the subject matter of any of Examples 43-56, and further specifies that the computing device further includes an antenna communicatively coupled to the circuit board.

Example 58 includes the subject matter of any of Examples 43-57, and further specifies that the computing device further includes a housing around the die and the circuit board.

Example 59 includes the subject matter of any of Examples 58, and further specifies that the housing includes a plastic material.

Example 60 is a computing device, including: a die including any of the microelectronic structures of any of Examples 1-42; and a circuit board, wherein the die is communicatively coupled to the circuit board.

Example 61 includes the subject matter of Example 60, and further specifies that the die is included in a package, and the package is communicatively coupled to the circuit board.

Example 62 includes the subject matter of Example 61, and further specifies that the package is communicatively coupled to the circuit board by solder.

Example 63 includes the subject matter of any of Examples 60-62, and further specifies that the circuit board is a motherboard.

Example 64 includes the subject matter of any of Examples 60-63, and further specifies that the die is part of a processing device or a memory device.

Example 65 includes the subject matter of any of Examples 60-64, and further specifies that the computing device is a mobile computing device.

Example 66 includes the subject matter of any of Examples 60-64, and further specifies that the computing device is a laptop computing device.

Example 67 includes the subject matter of any of Examples 60-64, and further specifies that the computing device is a desktop computing device.

Example 68 includes the subject matter of any of Examples 60-64, and further specifies that the computing device is a wearable computing device.

Example 69 includes the subject matter of any of Examples 60-64, and further specifies that the computing device is a server computing device.

Example 70 includes the subject matter of any of Examples 60-64, and further specifies that the computing device is a vehicle computing device.

Example 71 includes the subject matter of any of Examples 60-70, and further specifies that the computing device further includes a display communicatively coupled to the circuit board.

Example 72 includes the subject matter of any of Examples 60-71, and further specifies that the computing device further includes an antenna communicatively coupled to the circuit board.

Example 73 includes the subject matter of any of Examples 60-72, and further specifies that the computing device further includes a housing around the die and the circuit board.

Example 74 includes the subject matter of Example 73, and further specifies that the housing includes a plastic material.

Example 75 includes any of the manufacturing methods disclosed herein.

The invention claimed is:

1. A microelectronic structure, comprising:
a metallization layer including a conductive structure;
a first unordered lamellar region laterally spaced apart from and aligned with a bottom portion of the conductive structure; and
a second unordered lamellar region above the first unordered lamellar region, wherein the second unordered lamellar region is laterally spaced apart from and aligned with a top portion of the conductive structure.

2. The microelectronic structure of claim 1, wherein the first unordered lamellar region has a different unordered lamellar pattern than the second unordered lamellar region.

3. The microelectronic structure of claim 1, wherein the metallization layer includes first spacer portions adjacent to the bottom portion of the conductive structure, and the first unordered lamellar region includes material having a same material composition as the first spacer portions.

4. The microelectronic structure of claim 3, wherein the material is a first material, the second unordered lamellar region includes a second material different from the first material, and the second material is a dielectric material.

5. The microelectronic structure of claim 1, wherein the metallization layer includes second spacer portions adjacent to the top portion of the conductive structure, and the second unordered lamellar region includes material having a same material composition as the second spacer portions.

6. The microelectronic structure of claim 1, wherein the second unordered lamellar region includes material having a same material composition as the conductive structure.

7. The microelectronic structure of claim 1, further comprising:
a device layer; and
additional metallization layers, wherein the metallization layer is between the device layer and the additional metallization layers.

8. A microelectronic structure, comprising:
a metallization layer including first conductive structures alternating with second conductive structures;
wherein individual ones of the first conductive structures include a bottom portion and a top portion, individual cap structures are on individual ones of the second conductive structures, the bottom portions of the first conductive structures are laterally spaced apart from and aligned with the second conductive structures, and the top portions of the first conductive structures are laterally spaced apart from and aligned with the cap structures.

9. The microelectronic structure of claim 8, wherein an individual cap structure includes silicon and nitrogen.

10. The microelectronic structure of claim 8, wherein individual ones of the first conductive structures have straight sidewalls.

11. The microelectronic structure of claim 8, further comprising: transistor contacts; wherein individual ones of the first conductive structures are above and vertically aligned with individual ones of the transistor contacts.

12. The microelectronic structure of claim 11, wherein the transistor contacts include one or more gate contacts.

13. The microelectronic structure of claim 11, wherein the transistor contacts include one or more source/drain contacts.

14. The microelectronic structure of claim 11, wherein the transistor contacts are in trenches, and the trenches also includes a metal oxide.

15. The microelectronic structure of claim 14, wherein individual ones of the transistor contacts are between a first portion of metal oxide and a second portion of metal oxide in an individual trench.

16. The microelectronic structure of claim 8, wherein the metallization layer is a first metallization layer over a device layer.

17. A computing device, comprising:
a die including a microelectronic structure, wherein the microelectronic structure includes first conductive structures alternating with second conductive structures, individual ones of the first conductive structures include a bottom portion and a top portion, individual cap structures are on individual ones of the second conductive structures, the bottom portions of the first conductive structures are aligned with the second conductive structures, and the top portions of the first conductive structures are aligned with the cap structures; and
a circuit board, wherein the die is communicatively coupled to the circuit board.

18. The computing device of claim 17, wherein the first conductive structures and the second conductive structures are horizontally aligned with an unordered lamellar region.

19. The computing device of claim 18, wherein the unordered lamellar region is part of a transition region of the die, under a guard ring of the die, or in a frame of the die.

20. The computing device of claim 17, wherein the die is included in a package, and the package is communicatively coupled to the circuit board.

* * * * *